US008500973B2

(12) United States Patent
Ockenfuss et al.

(10) Patent No.: US 8,500,973 B2
(45) Date of Patent: *Aug. 6, 2013

(54) ANODE FOR SPUTTER COATING

(75) Inventors: Georg J. Ockenfuss, Santa Rosa, CA (US); Richard I. Seddon, Sunnyvale, CA (US)

(73) Assignee: JDS Uniphase Corporation, Milpitas, CA (US)

(*) Notice: Subject to any disclaimer, the term of this patent is extended or adjusted under 35 U.S.C. 154(b) by 639 days.

This patent is subject to a terminal disclaimer.

(21) Appl. No.: 12/402,322

(22) Filed: Mar. 11, 2009

(65) Prior Publication Data
US 2009/0250341 A1   Oct. 8, 2009

Related U.S. Application Data

(63) Continuation-in-part of application No. 11/074,249, filed on Mar. 7, 2005, now abandoned.

(60) Provisional application No. 60/603,211, filed on Aug. 20, 2004.

(51) Int. Cl.
C23C 14/00 (2006.01)
C25B 11/00 (2006.01)
C25B 13/00 (2006.01)

(52) U.S. Cl.
USPC .................. 204/298.14; 204/298.02

(58) Field of Classification Search
USPC .......................... 204/298.14, 298.02
See application file for complete search history.

(56) References Cited

U.S. PATENT DOCUMENTS

| 3,391,071 A * | 7/1968 | Theuerer .................. 204/192.12 |
| 3,514,391 A | 5/1970 | Hablanian et al. ....... 204/298.06 |
| 3,528,906 A | 9/1970 | Cash et al. ............... 204/298.06 |
| 3,616,452 A | 10/1971 | Bessot et al. ............. 204/298.06 |
| 4,169,031 A | 9/1979 | Brors ........................ 204/192 R |
| 4,222,345 A | 9/1980 | Bergfelt ........................ 118/720 |
| 4,250,009 A | 2/1981 | Cuomo et al. ........... 204/192.11 |
| 4,318,796 A | 3/1982 | Nishiyama et al. ...... 204/298.09 |
| 4,351,697 A | 9/1982 | Shanefield et al. ............. 216/18 |
| 4,478,702 A | 10/1984 | Gillery et al. ................. 204/298 |

(Continued)

FOREIGN PATENT DOCUMENTS

| DE | 3835153 | 4/1990 |
| DE | 3934887 | 4/1990 |

(Continued)

OTHER PUBLICATIONS

Abstract Translation JP53100979 A.*

(Continued)

*Primary Examiner* — Keith Hendricks
*Assistant Examiner* — Ibrahime A Abraham
(74) *Attorney, Agent, or Firm* — Matthew A. Pequignot; Pequignot + Myers LLC

(57) ABSTRACT

A sputtering anode is disclosed wherein the anode is in the form of a container or vessel; and, wherein the conducting surface communicating with a cathode is the inside surface of the container or vessel. The anode can be mounted outside of a coating chamber having its opening communicating with the chamber or alternatively may be mounted within the chamber. The anode may be an inlet port for receiving inert gas for use in forming the plasma and for pressurizing the anode.

19 Claims, 15 Drawing Sheets

U.S. PATENT DOCUMENTS

| | | | | |
|---|---|---|---|---|
| 4,569,745 A | 2/1986 | Nagashima | | 204/298 |
| 4,610,770 A | 9/1986 | Saito et al. | | 204/192.1 |
| 4,619,755 A | 10/1986 | Hessberger et al. | | 204/298.14 |
| 4,721,553 A | 1/1988 | Saito et al. | | 204/192.12 |
| 4,744,880 A | 5/1988 | Gillery et al. | | 204/298 |
| 5,269,896 A | 12/1993 | Munemasa et al. | | 204/192.38 |
| 5,306,406 A | 4/1994 | Palmieri et al. | | 204/192.24 |
| 5,334,298 A | 8/1994 | Gegenwart | | 204/192.12 |
| 5,364,689 A | 11/1994 | Kashiwagi et al. | | 428/195.1 |
| 5,507,931 A | 4/1996 | Yang | | 204/192.15 |
| 5,540,823 A | 7/1996 | Fritsche | | 204/298.19 |
| 5,573,596 A | 11/1996 | Yin | | 118/723 E |
| 5,591,313 A * | 1/1997 | Barber et al. | | 204/192.12 |
| 5,647,912 A | 7/1997 | Kaminishizono et al. | | 118/719 |
| 5,662,784 A | 9/1997 | Schuhmacher et al. | | 204/298.07 |
| 5,683,558 A | 11/1997 | Sieck et al. | | 204/192.12 |
| 5,736,021 A | 4/1998 | Ding et al. | | 204/298.11 |
| 5,795,448 A | 8/1998 | Hurwitt et al. | | 204/192.1 |
| 5,851,365 A | 12/1998 | Scobey | | 204/192.12 |
| 5,911,861 A | 6/1999 | Dubs et al. | | 204/298.27 |
| 6,114,018 A | 9/2000 | Phillips et al. | | 428/200 |
| 6,190,513 B1 | 2/2001 | Forster et al. | | 204/192.12 |
| 6,838,166 B2 | 1/2005 | Phillips et al. | | 428/323 |
| 2001/0015438 A1 | 8/2001 | Callegari et al. | | 257/40 |
| 2002/0029960 A1* | 3/2002 | Morimoto et al. | | 204/192.12 |
| 2006/0081468 A1 | 4/2006 | Sidon et al. | | 52/528 |

FOREIGN PATENT DOCUMENTS

| | | |
|---|---|---|
| DE | 4306611 | 9/1994 |
| EP | 0541903 | 5/1993 |
| EP | 1 353 197 | 10/2003 |
| EP | 1 741 757 | 1/2007 |
| JP | 53100979 A * | 9/1978 |
| JP | 61010239 | 1/1986 |
| RU | 2008501 | 2/1994 |
| WO | WO89/03584 | 4/1989 |
| WO | WO02/19379 | 3/2002 |
| WO | WO 2005/017048 | 2/2005 |

OTHER PUBLICATIONS

Machine translation of DE 4306611 A1.*

P. Sieck: "Effect of Anode Location on Deposition Profiles for Long Rotatable Magnetrons", SVC, 37th Annual Technical Conf. Proceed., 233, (1994).

J.R. Doyle et al., "Effect of Anode Bias on Plasma Confinement in Direct Current Magnetron Discharges", J. Vac. Sci. Technol., A12(3), pp. 886-888, May/Jun. 1994.

S. Schiller, K. Goedicke, V. Kirchhoff, T. Kopte, "Pulsed Technology—a new era of magnetron sputtering", 38th Annual Technical Conference of SVC, Apr. 1995.

P. Sieck, "Active Control of Anode Current Distribution for D.C. Reactive Sputtering of $SiO_2$ and $Si_3N_4$,", Surface and Coatings Technology, 68/69, pp. 794-798, 1994.

Richard Scholl et al., "Redundant Anode Sputtering: A Novel Approach to the Disappearing Anode Problem", http://www.advanced-energy.com/upload/white2.pdf, 2000.

H. A. Macleod, "Thin-Film Optical Filters", third edition, Institute of Physics Publishing, Dirac House, Temple Back, Bristol BS1 6BE, UK, 2001, pp. 488-493.

Philip Baumeister, "Optical Coating Technology", SPIE, Bellingham, WA, 2004, pp. 9-22 to 9-43.

European Search Report, May 23, 2007, from EP application No. 05255082 filed Aug. 17, 2005.

European Search Report, Mar. 18, 2009, from EP application No. 05254602 filed Jul. 23, 2005.

Machine Translation of EP0541903A1 to Wolf, May 19, 1993.

* cited by examiner

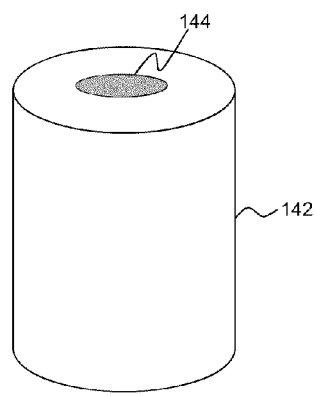
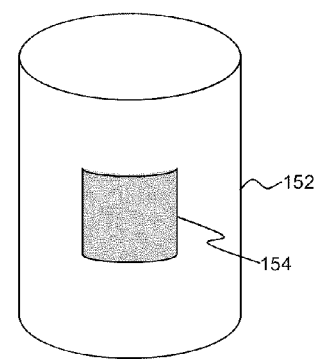
FIG. 1d  FIG. 1e

ANODE FOR SPUTTER COATING

CROSS-REFERENCE TO RELATED APPLICATIONS

The present application is a continuation-in-part of U.S. patent application Ser. No. 11/074,249 filed Mar. 7, 2005, which claims priority from U.S. patent application No. 60/603,211 filed Aug. 20, 2004, both of which are incorporated herein by reference for all purposes.

FIELD OF THE INVENTION

This invention relates generally to an apparatus and method for depositing films on a substrate, and more particularly to a reactive magnetron sputtering device and technique for depositing materials onto substrates in which the deposited films have predictive thickness distribution and in which the apparatus can operate continuously and repeatedly for very long periods.

BACKGROUND OF THE INVENTION

In a sputtering deposition process ions are usually created by collisions between gas atoms and electrons in a glow discharge. The ions are accelerated into the target cathode by an electric field causing atoms of the target material to be ejected from the cathode surface. A substrate is placed in a suitable location so that it intercepts a portion of the ejected atoms. Thus, a coating of target material is deposited on the surface of the substrate.

Sputter coating is a widely used technique for depositing a thin film of material on a substrate. Sputtering is the physical ejection of material from a target as a result of gas ion bombardment of the target. In one form of this technique, known as DC sputtering, positive ions from a plasma discharge formed between an anode and a target cathode are attracted to and strike the target cathode, dislodging atoms from the target surface of the cathode thereby providing sputtering atoms. Some of the dislodged atoms impinge on the surface of the substrate and form a coating. In reactive sputtering a gaseous species is also present at the substrate surface and reacts with, and in some embodiments combines with, the atoms from the target surface to form the desired coating material.

The sputtered material is also deposited on any other surface exposed to the sputtered atoms. It is recognized in the prior art that if the coating is an electrically insulating material, such as a metal oxide, the build up of the material on other parts of the sputtering apparatus can cause problems. In particular, the build up of an insulating coating on the anode interferes with the ability of the anode to remove electrons from the plasma, as required to maintain the plasma's charge balance. This destabilizes the plasma and interferes with deposition control. As a result, it is common to use a different sputtering technique, for example RF sputtering, to deposit layers of insulating materials. However, RF sputtering is a less efficient, less controllable, slower and more expensive process than DC sputtering.

In operation, when the argon is admitted into a coating chamber, the DC voltage applied between the target cathode and the anode ignites the argon into a plasma, and the positively charged argon ions are attracted to the negatively charged target. The ions strike the target with a substantial energy and cause target atoms or atomic clusters to be sputtered from the target. Some of the target particles strike and deposit on the wafer or substrate material to be coated, thereby forming a film.

In an endeavor to attain increased deposition rates and lower operating pressures, magnetically enhanced targets have been used. In a planar magnetron, the cathode includes an array of permanent magnets arranged in a closed loop and mounted in a fixed position in relation to the flat target plate. Thus, the magnetic field causes the electrons to travel in a closed loop, commonly referred to as a "race track", which establishes the path or region along which sputtering or erosion of the target material takes place. In a magnetron cathode, a magnetic field confines the glow discharge plasma and increases the path length of the electrons moving under the influence of the electric field. This results in an increase in the gas atom-electron collision probability thereby leading to a much higher sputtering rate than that obtained without the use of magnetic confinement. Furthermore, the sputtering process can be accomplished at a much lower gas pressure.

As mentioned heretofore, in DC reactive sputtering, a reactant gas forms a compound with the material which is sputtered from the target plate. When the target plate is silicon, and the reactive gas is oxygen, silicon dioxide is formed on the surface of the substrate. However, because silicon dioxide is a good insulator, a film thick enough to cause arcing is rapidly formed in areas outside of the race track, e.g. on electrically grounded dark space shields. Silicon dioxide is known to be one of the most difficult dielectric films to deposit by magnetron reactive sputtering because of this characteristic. The arcing associated with silicon dioxide has prevented planar magnetron reactive sputtering from being efficiently utilized to deposit high quality silicon dioxide films. One aspect of this invention provides a coated cathode having its sides and bottom surface coated with a dielectric to lessen or obviate arcing.

In operation, due to the accumulation of dielectric material in various parts of the coating chamber, it has been necessary to clean the system on a regular basis. Indeed, when coating silicon dioxide or silicon nitride by reactive sputtering, typical systems can only operate continuously for relatively short periods of time.

Finally, another limitation to the utility of planar and cylindrical magnetrons in either reactive or non-reactive sputtering is that films deposited by sputtering have not achieved the degree of uniformity or repeatability required for many high precision applications.

There have been many attempts to ameliorate these unwanted effects of magnetron sputtering. For example "bottle-brush" anodes have been proposed and are described in U.S. Pat. No. 5,683,558 in the name of Sieck et al, issued Nov. 4, 1997. This kind of anode advantageously provides a large surface but, depending on its position relative to the target, it becomes non-uniformly coated over time and causes the anode to move to other surfaces in the deposition system. Additionally, the distance between the brush needles is very close and often leads to an increased anode voltage, especially at low pressure.

Anode plates and ring designs have been described by F. Howard Gillery et al., PPG Industries Inc., in U.S. Pat. No. 4,478,702, entitled "Anode for magnetic sputtering apparatus", and in U.S. Pat. No. 4,744,880, entitled "Anode for magnetic Sputtering of gradient films", and by P. Sieck in "Effect of Anode Location on Deposition Profiles for Long Rotatable Magnetrons", SVC, 37th Annual Technical Conf. Proceed., 233, (1994).

Anode plates and ring designs described by J. R. Doyle, et al., in J.Vac. Sci. Technol. A12, 886 (1994) are the most widely used design for anodes. Typically the anode is in close proximity to the cathode to enable a sufficient coupling of the anode-to-cathode plasma. Most often the gas inlet is close to the target surface to increase the target pressure locally. Most of the time the anode surface is also close to that location which increases the plasma coupling and reduces the anode voltage. Unfortunately these types of anodes can't be positioned too far behind the cathode, because the electrons have to cross magnetic field lines on route to the anode which adds a high resistance and increases the anode voltage. On the other hand, having the anode close to the cathode surface increases the anode's susceptibility to being coated with sputtered material thereby making the anode unstable.

It is known to position dispose the anode in close proximity to other plasma sources out of the direct line of sight of the cathode. This approach works for relatively thin coatings, for example coatings of less than 5 µm, but for thicker films the anode becomes coated as well due to gas scattering. This makes it necessary to routinely exchange the anodes, which increases the cycle time and adds to the cost.

One disadvantage to the aforementioned approaches is that the size of the anodes has to be relatively large to work at a reasonably low voltage. The large size leads to an uneven contamination of the anode surface and to a change in sputter distribution. Furthermore, a large anode has to be accommodated within the coating chamber where space is typically lacking.

A small filament-like anode is another form of prior art anode. This anode requires relatively high voltages for example, greater than 70 V, which typically leads to undesirable sputtering of surfaces at or near the anode. The anode has to be positioned very close to the cathode for sufficient coupling. Additionally, major changes to the magnetron generally have to be made by way of shunting the magnetic fields close to the anode.

Dual magnetron AC sputtering has been proposed by S. Schiller, K. Goedicke, V. Kirchhoff, T. Kopte in "Pulsed Technology—a new era of magnetron sputtering", 38th Annual Technical Conference of SVC, (1995).

This approach inherently solves the moving anode and disappearing anode problems of some of the aforementioned prior art anodes, but the sputtering rates are usually lower and AC sputtering needs a higher pressure to run at decent cathode voltages <900 V. This increases the gas scatter and thus the defect growth. But even at 'low' average voltage the peak voltage in this setup is very high and often greater than 1000 V and leads to an increased compressive stress in the coating. The high voltage is caused by igniting the plasma every half-cycle at each cathode.

The very recent approach of Dual anode magnetron sputtering to solve the anode problem uses a dual anode AC configuration. Preliminary tests showed that the anodes have to be highly coupled into the cathode plasma. Thus, they have had to be positioned very close to the cathode. Because the anode reaches very high negative voltages, this causes sputtering from the anode during the cleaning cycle. In a paper entitled "Redundant Anode Sputtering: A Novel Approach to the Disappearing Anode Problem", published on the internet at the following website: http://www advanced-energy.com/upload/white2.pdf, several disadvantages of Dual cathode AC sputtering are mentioned.

Since the anode is generally close to the target, it is exposed to coating material. In practice, in many prior art systems, anodes have to be exchanged or cleaned at frequent, regular intervals. Even when the anode is out of a direct line of sight of the direct material flux, the anode becomes coated due to gas scattering of coating material.

It is an object of this invention to provide an anode that is extremely well shielded from coating material. The provision of such an anode leads to a more stable sputtering process, especially for very thick coatings, and reduces or eliminates the maintenance of the anode. This reduces the cycle time and labor costs in coating substrates.

It is a further object of this invention to provide an anode which can be pressurized and which requires a lower voltage than many prior art anodes. Although the anode can be pressurized, it operates within or communicates with a chamber under vacuum.

It is a further object of this invention to provide an anode wherein little or no arcing at or near the anode occurs.

It is yet a further object of this invention to provide a preferred cathode for use with the anode of this invention.

SUMMARY OF THE INVENTION

In accordance with the invention, there is provided an apparatus anode for use in the sputtering of a material, comprising at least one anode defining a vessel having an opening to an electrically conductive inner body and having an outer body, the electrically conductive inner body being coupled to a voltage source to provide a voltage difference between the sputtering material and the conductive inner body.

In accordance with an aspect of the invention there is provided a sputtering apparatus anode for use in the sputtering of a material, comprising:
at least one anode defining a substantially closed vessel comprising one or more sidewalls and a bottom wall, said vessel having an opening to an electrically conductive inner body and having an outer body, wherein the inner and outer body are at a same electrical potential and are formed of the one or more sidewalls and bottom wall, such that the inner body is the inside one or more sidewalls and bottom wall of the vessel and an outside one or more sidewall forms the outer one or more sidewalls and outer bottom wall of the vessel, the electrically conductive inner body being coupled to a voltage source for providing a voltage difference between the sputtering material and the conductive inner body, wherein the inner body of the vessel is for receiving and collecting electrons or negatively charged particles passing through the opening, wherein the opening to the electrically conducting inner body is so located for communicating with a coating chamber and wherein the anode is electrically isolated from the coating chamber and electrically connected to a positive potential, wherein the opening of the vessel is polygonal shaped.

In accordance with an aspect of the invention, there is provided, a sputtering apparatus anode for use in the sputtering of a material, comprising at least one anode defining a vessel having an electrically conductive inner body and an outer body, the electrically conductive inner body being coupled to a voltage source for providing a voltage to the inner body.

In accordance with another aspect of the invention there is provided a coating chamber including a cathode, the chamber having in communication therewith, an opening of an end of an anode in the form of a vessel.

BRIEF DESCRIPTION OF THE DRAWINGS

Exemplary embodiments of the invention will now be described in accordance with the drawings, in which:

FIG. 1d is an isometric view of an anode having a single opening at an upper end thereof.

FIG. 1e is an isometric view of an anode having a single opening in a side thereof.

DETAILED DESCRIPTION

Figure 1A:
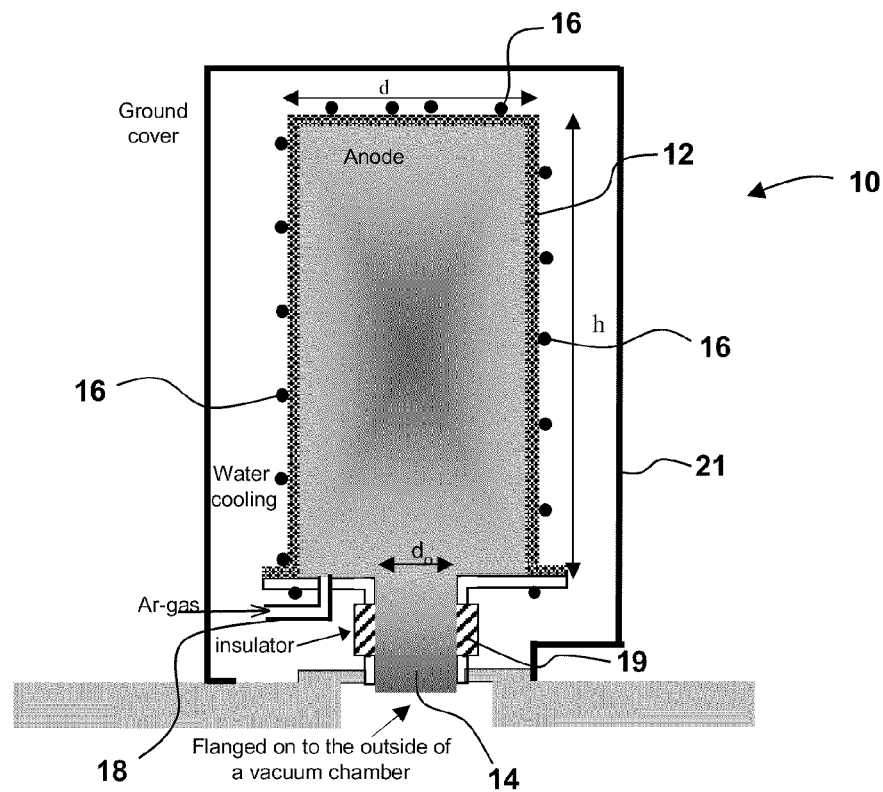
FIG. 1a is a cross sectional view of a small portion of a coating chamber in accordance with an embodiment of the invention including a cylindrical hollow anode with a length h, diameter d and an orifice opening do at an end of the anode coupled to an opening in the coating chamber.

Referring now to FIG. 1a an anode 10 is shown in the form of a container or vessel having conductive walls of copper or stainless steel 12 having an opening 14 at a first end for communicating with a vacuum chamber to which it is directly coupled. The copper or stainless steel walls define the inside of the container vessel or inner body of the container. The outside walls of the container are referred to hereafter as the outer body. The outer body may be coated with a suitable coating so as to be electrically insulated. In the cross sectional view water cooling pipes 16 are shown substantially around the anode for maintaining the temperature of the anode in operation. A gas inlet port 18 is shown for providing a conduit into which gas may enter the anode cavity to pressurize the anode. A ground cover 21 is placed around the anode and cooling pipes and is at ground potential. In operation the anode is pressurized with argon gas which promotes the formation of plasma in the presence of a suitable ignition voltage and maintenance voltage thereafter. The anode 10 is essentially a conducting container, which in a preferred embodiment is mounted onto the vacuum chamber; alternatively, it may reside within the vacuum chamber. The anode shown in FIG. 1a was designed to function with a low anode voltage and little or no arcing. It is preferred that the anode be at a voltage of 10 to 60 volts above ground or above the cathode chamber voltage and more preferably a low anode voltage of approximately 30 volts is preferred to reduce process variation.

Figure 1B:
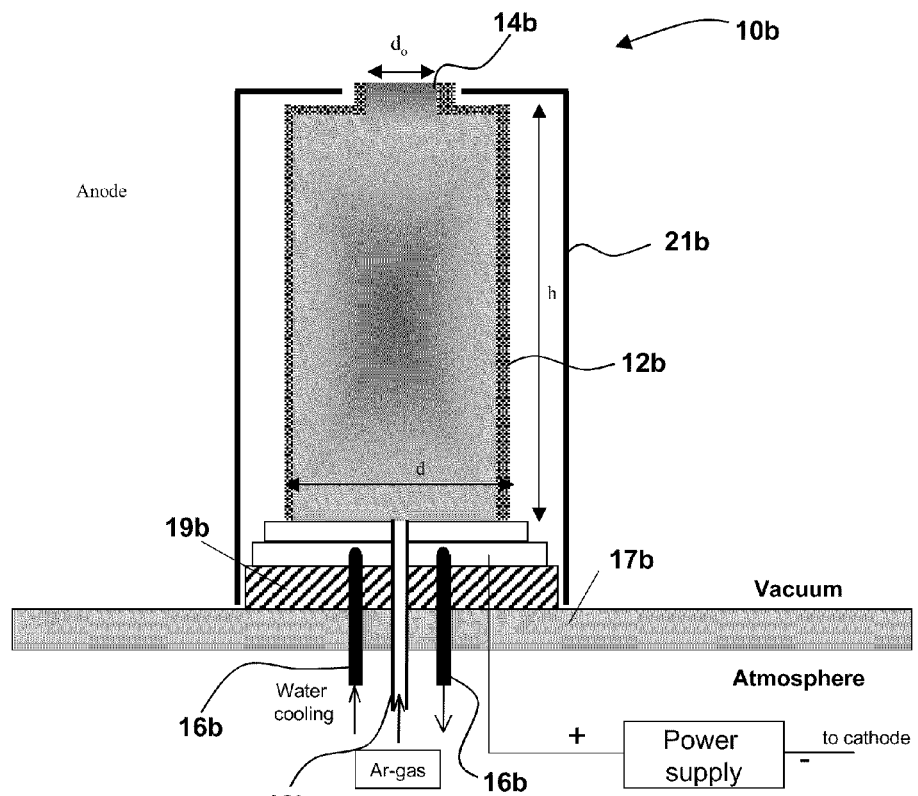
FIG. 1b is a cross sectional view of a coating chamber in accordance with an embodiment of the invention including a cylindrical hollow anode with a length h, diameter d and an orifice opening do at an end of the anode, wherein the anode is located shown within the coating chamber.

Referring now to FIG. 1b, an anode similar to the one shown in FIG. 1a is shown, wherein the entire anode body 10b, 21b is shown disposed within a vacuum coating chamber and wherein the opening 14b having a diameter d0 is for communicating with the target cathode sputtering material within the vacuum chamber. Water cooling tubing 16b is shown having inlet and outlet ports entering and exiting from outside the vacuum chamber. The Ar-gas port 18b is shown to communicate with the anode and supply the anode with gas from outside the vacuum chamber. Notwithstanding the anode is considered to be a closed vessel with the exception of the opening 14b for receiving electrons. An insulator 19b ensures the anode is electrically insulated from the chamber wall and a power supply is shown to provide a voltage difference between the anode and cathode or cathode material within the chamber. The e anode is at a higher potential than the chamber wall so that electrons will flow into the anode opening rather than being attracted to the chamber walls.

Figure 1C:
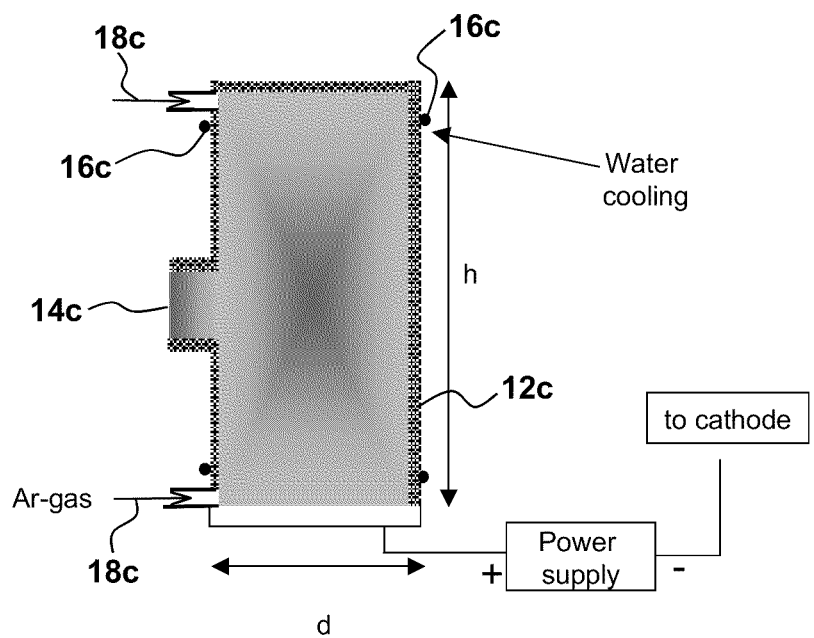
FIG. 1c is an alternative embodiment of the anode wherein the opening of the anode is at a side thereof, or side end of the anode.
Figure 1F:
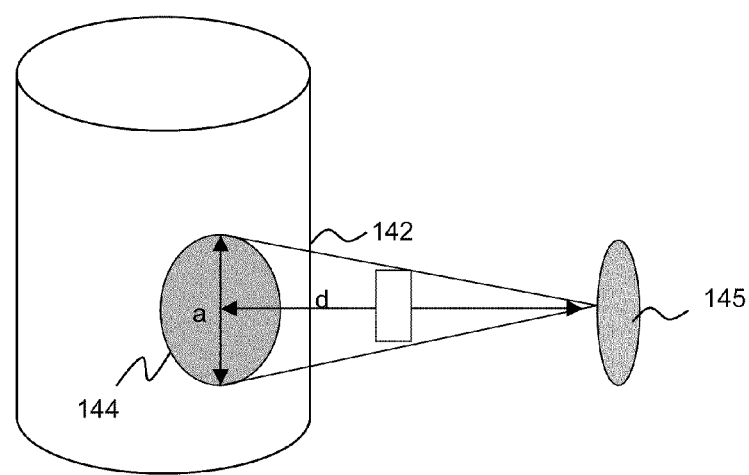
FIG. 1f is an isometric view of an anode a cathode a distance d away from the anode opening.

FIG. 1c shows an alternative embodiment wherein an anode having copper walls 12c have an opening 14c at a different location which is at the side of the cylinder. In this embodiment the anode can be mounted within or external to the vacuum chamber. Water cooling pipes 16c, and Ar-gas port 18c are provided.

Referring now to FIG. 1d a cylindrical shaped vessel 142 forming an anode is shown having a single opening 144 at an end thereof wherein the opening 144 is circular in shape forming a polygon. Thus, when looking into the opening from outside of the vessel one can see an opening having a shape of a circle. For the purposes of this specification the term polygon shall include all bounded n-sided shapes including shapes wherein n approaches or is ∞ such as circles and ellipses and other closed smooth shapes; thus the circular shaped opening of this invention forms a polygon.

FIG. 1e. Illustrates the relationship between the largest opening "a" or diameter of the vessel 142 and the angle α formed with respect to the distance of the opening from a cathode 145. The angle α is 90 degrees or less and preferably 70 degrees and most preferably about 20 degrees. Although in many of the figures the opening is shown directly facing the cathode this is not a requirement.

In a preferred embodiment of the invention, the vessel forming the anode, for all intents and purposes forms a closed vessel having an opening at an end or side thereof for allowing electrons to pass therethrough. In some instances a supply line for providing a gas to the inside region of the anode is present, however the vessel is a substantially closed vessel other than having an opening for allowing electrons to pass therethrough. Structures such as channels or cylinders open at opposite ends which are substantially open structures are not considered within this specification to be vessels. A vessel is a structure capable of holding a fluid albeit having an opening for allowing the fluid or as it be in the instant invention, allowing electrons to flow thereinto from the cathode. In a preferred embodiment of this invention the vessel is preferably free of physical structures within it that would obstruct electrons from entering the vessel and reaching the inner sidewalls of the vessel; thus the vessel is preferably a relatively smooth walled jug, jar, or box type vessel having no physical structures within and having a single opening for allowing electrons to pass thereinto. In most instances the single opening has a polygonal shaped cross section. However the opening may be formed in a side wall of a cylindrical vessel which would have a polygonal shaped opening.

Figure 7:
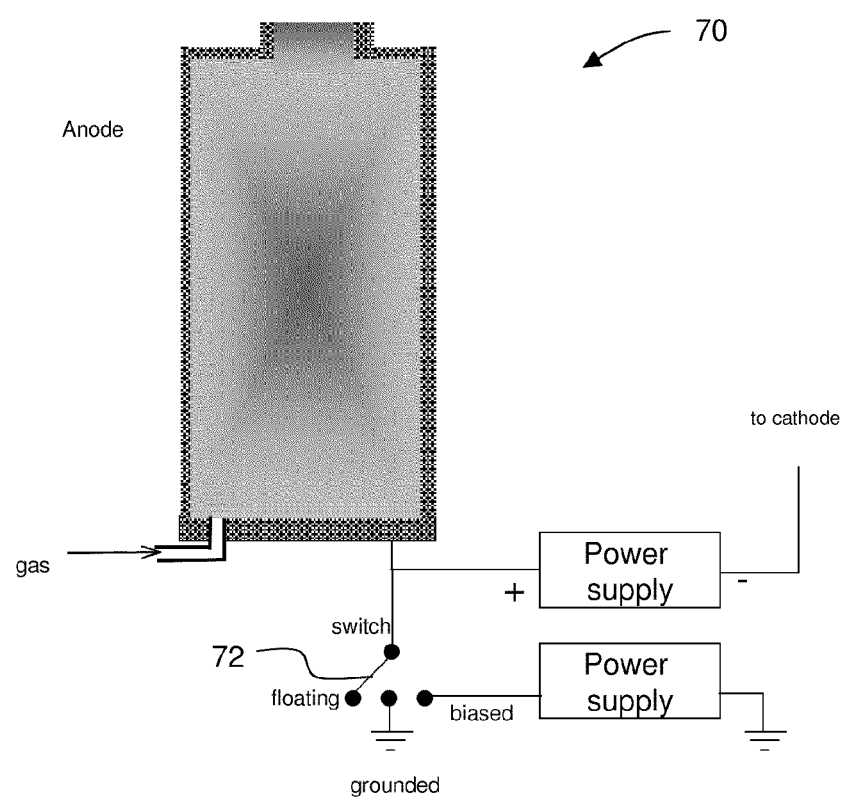
FIG. 7 is a cross sectional view of an anode in accordance with an embodiment of this invention wherein the anode is connected to a power supply.

Referring to FIG. 7 circuitry is shown which allows three switchable modes of electrical operation of the anode 70. The switch 72 allows switchable selection between 'floating', 'grounded', and 'biased' operation.

In floating operation the potential of the anode relative to ground is self adjusting. In this instance the anode voltage depends upon the plasma impedance. For DC sputtering the typical anode voltage is measured to be between +20V and +55V, whereas the cathode voltage can be anywhere between −300V and −700V, depending upon which materials are coated and which process parameters are used. Sometimes a resistor is provided between the ground and the anode to protect the system in case of a catastrophic breakdown.

In grounded operation mode the anode is connected to chamber ground. To be the preferred return path for the electrons, the anode needs to have superior conductivity over other grounded chamber components. Feeding process gas into the anode decreases the plasma impedance to the anode.

In biased operation the anode potential relative to ground is determined by a power supply. A voltage range of +20 to +55V makes the anode the preferred return path for electrons while maintaining a constant and repeatable operation.

Figure 2:
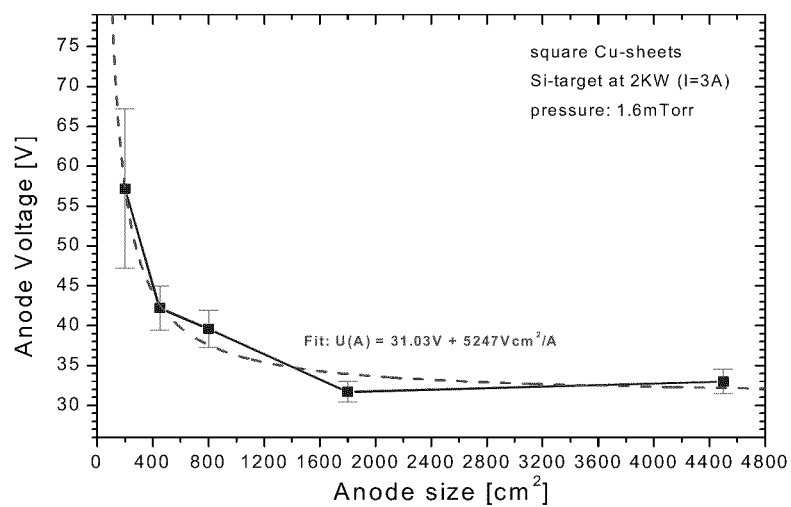
FIG. 2 is a graph illustrating the dependence of anode voltage on the size of the anode.
Figure 3:
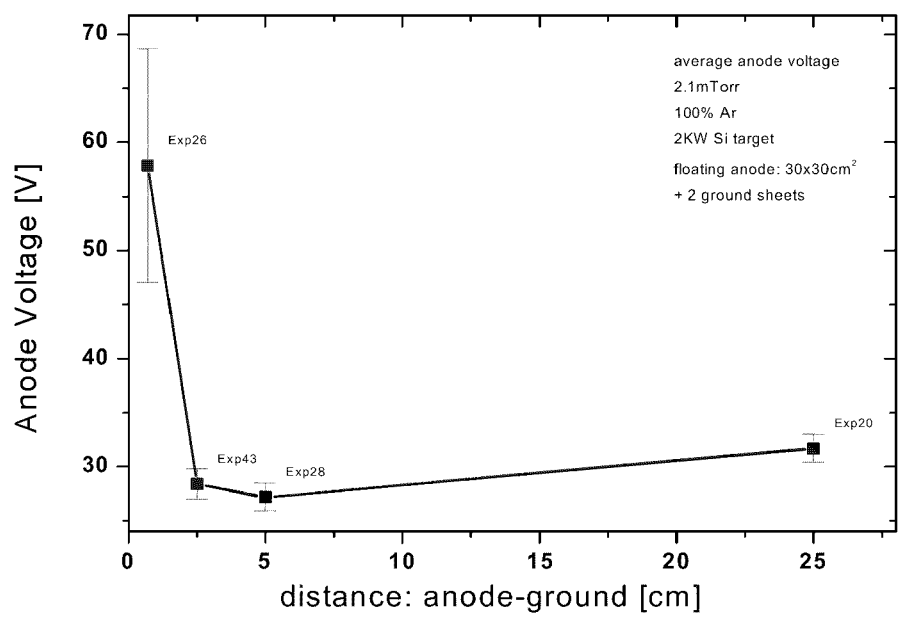
FIG. 3 is a graph illustrating the effect of anode voltage versus distance from a grounded surface close to the powered anode.

To minimize the anode voltage in the preferred floating mode, a minimum anode surface area as shown in FIG. 2 is required. Additionally, grounded surfaces have a major impact on the plasma impedance and thus the anode voltage. The results of experiments illustrated in FIG. 3 show that the closest grounded surface should be at least 25 mm away for this specific process parameter set.

Figure 4:
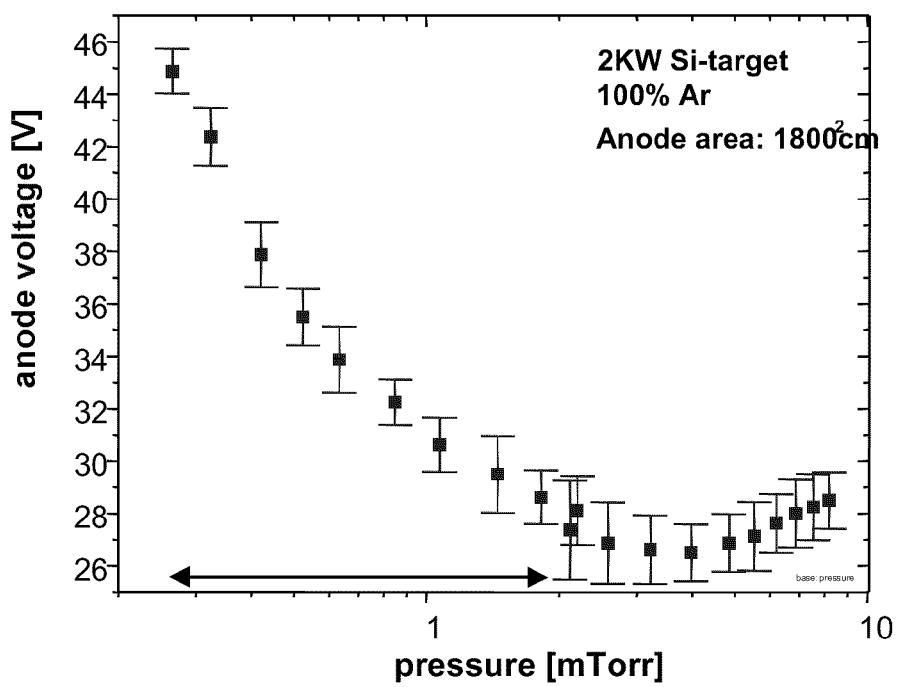
FIG. 4 is a graph illustrating pressure dependence of the anode voltage wherein the arrows indicate the pressure region in a typical sputtering process.

The pressure dependence of the anode voltage is shown in FIG. 4. The arrows indicate that the sputtering pressure does not always coincide with the optimum pressure for the powered anode.

The optimum anode parameters, that is, area, anode ground distance, and pressure, led to the embodiment where the anode surface is the inside of a container or vessel. In this preferred embodiment, the anode comprises a tube with a diameter of at least d=10 cm and a length of at least h=20 cm as shown in FIG. 1.

Figure 5:
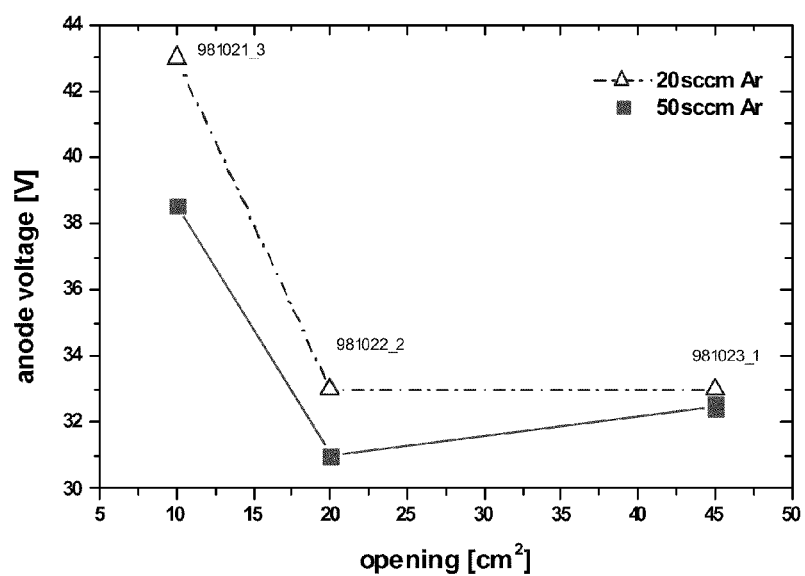
FIG. 5 is a graph illustrating anode voltage versus the area of the anode opening into the chamber for two different gas flows into the anode; and, FIG. 6 is a graph comparing the anode voltage versus time for a copper anode and a stainless steel anode.

For low scattering processes the chamber pressure is below 2 mTorr. A high pressure at the anode is achieved by reducing the orifice or opening 14 of the anode 10 and feeding the process gas into the anode via the inlet port 18. Since small orifices constrict the plasma leading to a reduction in electrical conductivity and thus to an increase of the anode voltage, it was discovered that an optimum opening has an area of about 20 cm2 and is preferably round. This relationship is depicted in FIG. 5.

Figure 6:
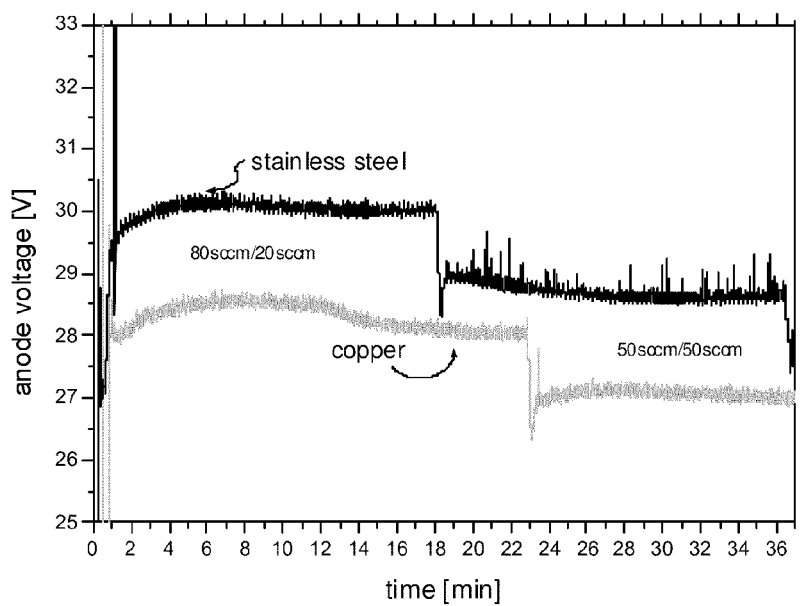

The anode can be made of a plurality of conducting materials. The impact of the anode material on the anode voltage is illustrated in FIG. 6. This graph illustrates that copper results in a 2 V lower anode voltage than stainless steel.

Since the anode can be mounted outside of the vacuum chamber advantageously it does not use up any space within the vacuum chamber and needs fewer vacuum components. By way of example, standard anodes need at least an additional electrical feed-through. The anode 10 shown in FIG. 1 is electrically insulated from the grounded chamber wall by way of an insulating material 19 shown. This is important since it is preferred for the anode to be able to have a free floating voltage which will typically be greater than that of the grounded chamber wall.

Advantageously, electrical and water feed-through connections and gas lines 18 can be mounted from the outside.

When the container anode is used as an external anode, the thickness of the walls have to be sufficient to withstand the atmospheric pressure; in the instance when the anode serves as an internal anode the anode can be quite thin as long as the anode does not become too highly electrically resistive.

In operation the anode can be pressurized to more than 3 mTorr. It is expected that this anode 10 can run in nearly continuous operation for extended periods of time; experiments have been carried out running this anode for more than 2000 hours continuously without having to take the anode 10 out of service to be cleaned or changed, and it is believed that it is possible to operate the anode for more than 10000 hours of continuous operation.

Although it is preferred to electrically insulate the outside of the anode container when part or the entire anode is within the coating chamber, it is not absolutely essential. Without any insulator on the outside of the anode, anode plasma in the orifice was observed and a low anode voltage was measured. Since the outside of the anode may act as an anode, when it is un-insulated, it would likely become coated over time, thereby changing the location of the anode which will effect the distribution and rate of sputtered particles at the cathode. Hence, it is preferable to electrically insulate the outside of the anode. The insulation of the outside can be a coating on the anode body, but alternatively can be an additional cover 21b as shown in FIG. 1b. The cover 21 can be grounded or floating.

The novel anode in accordance with this invention has several advantages over known anodes used in sputter coating:

a) In accordance with this invention, the active anode area or surface is on the inside of a container, which substantially protects the anode from sputtered material. This greatly contributes to process stability, because the properties of the anode surface and thus the plasma, location and conductivity do not change during a coating run, and are relatively constant from coating run to coating run.

b) The small orifice or container opening further reduces the chances of coating material finding its way to the anode surface. It also defines the location of the anode very well.

c) The small orifice or opening and gas inlet port locally increases the pressure inside the anode and thus reduces the anode voltage. The provision of Argon process gas into the anode increases the pressure locally inside the anode and further decreases the anode voltage without significantly increasing the chamber pressure.

d) The large surface (>1800 cm2) of the anode further reduces the anode voltage e) The spherical or cylindrical shaped anode increases the volume of the anode and also the distance between anode surfaces and eliminates grounded surfaces close to the active anode surface.

f) Water-cooling further adds to the stability of the anode. It reduces the change of the anode behavior due to an external temperature shift or due to excessive heating of the anode by a large anode current.

g) The anode of this invention usually does not need a second plasma, except the one from the cathode, to work at low voltages.

Figure 8:
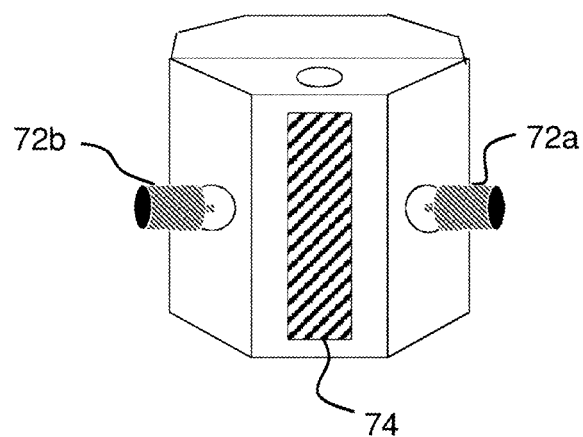
FIG. 8 is a diagram of a coating apparatus having two externally mounted anodes in accordance with an embodiment of this invention.
Figure 9:
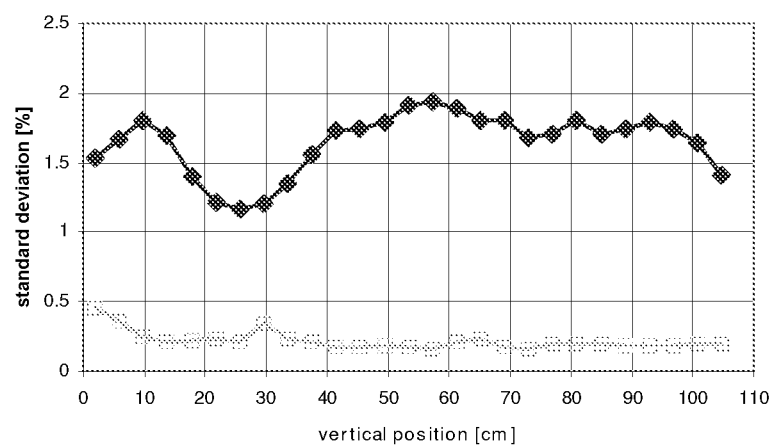
FIG. 9 is a graph depicting the standard deviation of the optical thickness of SiO2 of five consecutive coating runs measured at different vertical positions in a MetaMode® coating machine without an anode illustrated by the black, solid graph and of five consecutive coating runs with 2 powered anodes as shown in gray, open symbols.

It should be noted that numerous other embodiments may be envisaged without departing from the sprit and scope of the invention. For example FIG. 8 illustrates one of many possible anode configurations for elongated cathodes as used in a MetaMode® configuration. In this embodiment two anodes 72*a*, 72*b* are positioned symmetrically at the sides of a long planar Si cathode 74. Using this configuration the run-to-run variation in place of previously used configurations can be improved from a standard variation of 1.64% to 0.22%. This is illustrated in the graph shown in FIG. 9.

In a paper entitled "Active Control of Anode Current Distribution for D.C. Reactive Sputtering, of SiO2 and Si3N4" by P. Sieck published in Surface and Coatings Technology, 68/69, (1994) 794-798, incorporated herein by reference, methods for controlling the current distribution are described with respect to in-line coating systems.

The instant invention is believed to be applicable to this and other such in-line coating systems; for example it is believed that the use of multiple nodes could be used in such in-line coating systems. By way of example, the hollow anode described heretofore in accordance with this invention, could increase the performance of the anode arrangement scheme described in this publication by Sieck; by using the anode of this invention:
1) the active anode surface is protected from coating material,
2) anode locations are better defined,
3) gas-inlets are well defined;

Depending on the length of the cathode and space available in the machine one could have several anodes along the cathode which either are controlled electrically or wherein the gas flow through the anode is adjusted through the anode cavity to control the sputter distribution along the length of the cathode. Such adjustments could be done in-situ during a coating run, for example, with a feedback loop from in-situ spectral measurements.

Figure 10A:
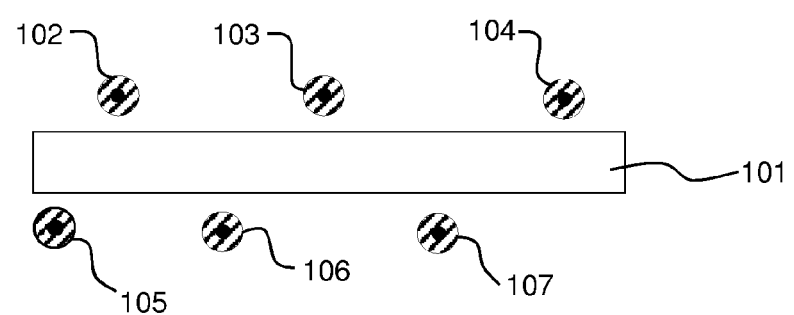
FIG. 10a is a plan view of a coating machine having multiple anodes and an elongated cathode in accordance with an embodiment of the invention.
Figure 10B:
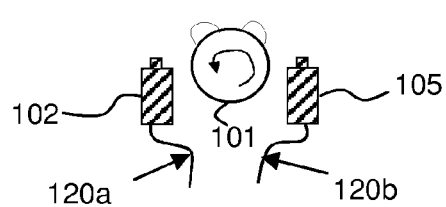
FIG. 10b is an end view of the coating machine shown in FIG. 10a wherein the elongated cathode is cylindrical
Figure 10C:
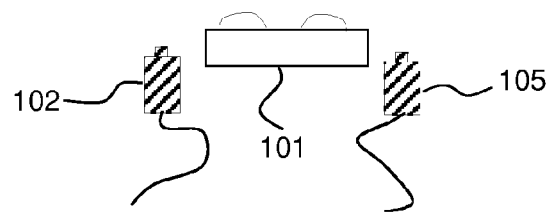
FIG. 10c is an end view of the coating machine of FIG. 10a wherein the cathode is a planar cathode.

Referring now to FIG. 10*a* a plan view is shown of a coating machine with an elongated cathode 101 having anodes 102 through 107 disposed about the anode. FIG. 10*b* is an end view of FIG. 10*a* wherein the elongated cathode 101 is a cylindrical cathode having independent gas inlets 120*a* and 120*b*. FIG. 10*c* is an end view of FIG. 10*a* wherein the cathode is a planar cathode.

In addition to providing a novel and inventive anode, an ever-increasing demand for low defect concentration in coated devices such as optical filters, mirrors, and semiconductor circuits requires a cathode that will have little or no arcing at the sputtering target. At present commercially available cathodes and also cathode designs described in prior art lack this important feature, especially when the deposition rate is being kept high.

Various solutions to the problem of unwanted arcing have been proposed, for example numerous shield designs placed about the cathode are known. Different magnet arrangements have been proposed to ameliorate this problem as well, but these solutions have their limitations and unwanted side-effects.

Another aspect of this invention is the provision of a cathode in conjunction with the described anode that essentially reduces any arcing to near zero or acceptable levels that do not have deleterious effects on the substrates being coated. The cathode in accordance with this invention together with the anode described heretofore provides a coating system that is highly reliable and requires very little down time. The combination of the anode and cathode disclosed here provides a coating mechanism that is unsurpassed by other known coating chambers.

Various prior art designs have been proposed to lessen unwanted sputtering at the cathode sides; for example providing electrically insulated shields, and various other forms of shielding; notwithstanding, most of these are not satisfactory. One known system is disclosed in U.S. Pat. No. 5,851,365. Systems of this type generally provide a dark-space shield that covers part of the target surface to prevent sputtering from the target mounting fixture. This typically causes a substantial amount of the coating to be deposited on the edge of the shield. In U.S. Pat. No. 5,851,365 a great deal of effort was directed to the shape of the shield, but it was found afterwards that some coating would build up and eventually fall back onto the target causing arcing which resulted in an increase in defects on the coated substrate. This is a significant problem especially for a load-lock system where the goal is to keep the machine at vacuum as long as possible. With coating build-up on the lower side of the dark-space shield and from re-deposited material onto the target surface, the dark-space itself decreases and sputtering from insulating material sets in which can result in substantial and significant unwanted arcing.

Other shielding solutions have been proposed, for example, U.S. Pat. No. 5,334,298 provides a cathode and shield where the marginal areas of the target lying outside the erosion zone are covered over by an extension of the dark space shield. In this embodiment the dark space shield is electrically floating and is separated from the target by a gap which is so large that no plasma can ignite between the target and the dark space shield. Although this arrangement appears to provide some advantages over others, it is sputter material specific and thus is relatively costly to implement.

In accordance with an aspect of this invention, a more elegant solution is provided which is relatively inexpensive to implement since it is found to work for multiple sputter materials and is believed to be superior to other prior art solutions.

Figure 11:
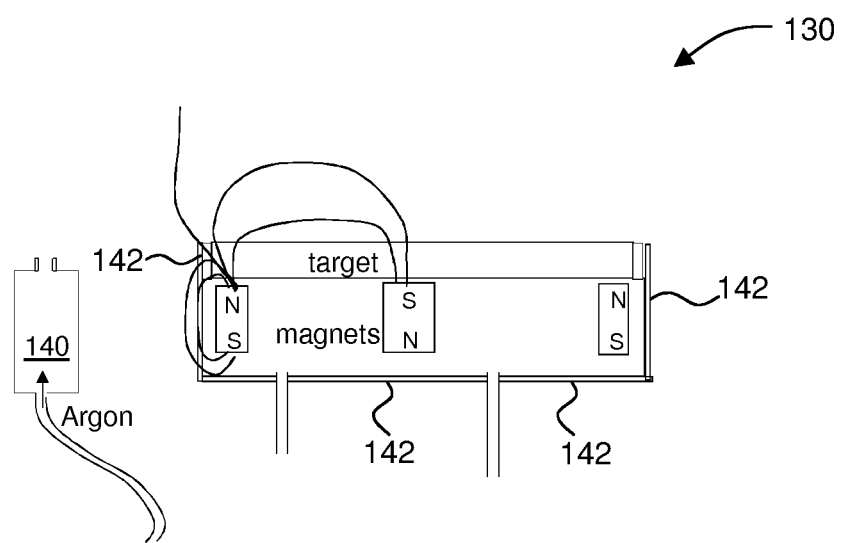
FIG. 11 is a view of a preferred cathode having its sides except for the target side insulated with a dielectric insulator adjacent to an anode disposed within a coating chamber in accordance with an embodiment of this invention.

Turning now to FIG. 11, a cathode 130 is shown with an anode 140, wherein gas is fed into the chamber, away from the cathode through the anode. This avoids high pressure in small volumes close to the cathode where the magnetic field is high, for example between the dark-space shield and cathode where sputtering has to be prohibited. Preferably the anode opening is at least 2 inches away from the cathode to enable a uniform pressure distribution over the target area. The anode voltage has been found to be insensitive to the distance between anode and cathode. Since this embodiment does not require a dark space shield, this eliminates coating flakes falling on the targets from a dark-space shield which typically extends into the flux of sputtered particles. When dark space shields are provided, the relatively sharp edge of the shield also leads to charge build-up, especially when coated with dielectric material, which too causes arcing. In this preferred cathode embodiment the sides of the cathode are electrically insulated. The electrical insulation 142 can be accomplished by the use of insulating materials or through application of an insulating coating. The dielectric coating can be a dense alumina applied through a plasma spray coating process. The cathode can be insulated by way of being coated with a layer of Kapton™ tape. Alternatively the cathode can be mounted on an insulating material such as Teflon™ or a ceramic. Alternatively sides of the cathode can be exposed to normal atmosphere where air becomes the electrical insulator. Combinations of above mentioned techniques can be used to insulate the cathode. Furthermore, extending the body of the cathode laterally so as to lessen the magnetic field that extends beyond the cathode body reduces the arcing. By insulating an extended cathode by plasma spraying alumina on its side and insulating the bottom with a Teflon™ plate it is possible to reduce the arc rate from >100 arcs/s to <0.1 arcs/s for the same deposition rate. This is a very inexpensive yet effective solution to the problem of unwanted arcing. The cathode in accordance with this invention can be used for metallic and dielectric coatings. The cathode can be driven with any electrical mode (RF, DC, pulsed DC, MF, dual cathode-AC, single cathode AC).

In summary, a novel container-like anode and coated cathode are provided that are unlike any known heretofore. Although individually, the anode and cathode are believed to be novel and inventive, they both contribute to provide a coating system that is highly advantageous. The embodiments shown are merely exemplary and numerous others may be envisaged within the spirit and scope of this invention.

What is claimed is:

1. A sputtering apparatus for use in the sputtering of a material, comprising:
   a cathode electrically coupled to a voltage source;
   at least one anode defining a substantially closed vessel comprising one or more sidewalls and a bottom wall, said vessel having an opening to an electrically conductive inner body and having an outer body, wherein the inner and outer body are at a same electrical potential and are formed of the one or more sidewalls and bottom wall, such that the inner body is the inside one or more sidewalls and bottom wall of the vessel and an outside one or more sidewall forms the outer one or more sidewalls and outer bottom wall of the vessel, wherein the electrically conductive inner body is coupled to the voltage source for providing a voltage difference between the sputtering material and the conductive inner body, wherein the inner body of the vessel is for receiving and collecting electrons or negatively charged particles passing through the opening, wherein the opening to the electrically conducting inner body is so located for communicating with a coating chamber and wherein the anode is electrically isolated from the coating chamber, wherein the opening of the vessel is polygonal shaped, wherein the cathode is negatively biased and wherein the anode is positively biased, the cathode and the anode forming a part of a same electrical circuit;
   wherein the opening is at one end or side face thereof, for communicating with a coating chamber and for allowing charged particles to flow between the electrically conductive inner body and the cathode external to the anode and within the coating chamber, and wherein the opening is at least two inches from a cathode within the coating chamber to facilitate a uniform pressure distribution over a target area, wherein the cathode is not within or encircled by the anode; and
   wherein the opening has a diameter or largest opening length of "a" and wherein the opening is a distance "d" from the cathode, and wherein an angle α=arctan (a/d) and wherein α<90 degrees.

2. A sputtering apparatus anode as defined in claim 1 wherein the conductive inner body of the anode is at a higher potential than the inner walls of the coating chamber so that a majority of electrons will preferably flow to the inside of the anode rather than to the inner walls of the coating chamber.

3. A sputtering apparatus anode as defined in claim 2, wherein the vessel has an inlet port for receiving an inert gas for igniting plasma in the presence of a sufficient voltage applied between the electrically conductive inner body and the cathode, and wherein the positive potential is at least 5V above ground.

4. A sputtering apparatus anode as defined in claim 1 adapted to be disposed outside of the coating chamber and physically coupled thereto such that the opening of the vessel is facing and open to the coating chamber.

5. A sputtering apparatus anode as defined in claim 1 wherein the outer body of the vessel is covered with a first material that is different than the inner body of the vessel.

6. A sputtering apparatus anode as defined in claim 5, wherein the first material is an insulating material.

7. A sputtering apparatus anode as defined in claim 1 wherein the anode inner body is coupled to a switch for selectably floating, biasing or grounding the inner body.

8. A sputtering apparatus anode as defined in claim 1 wherein the opening is substantially smaller than a circumference of the vessel so that charged particles can flow between the inner body of the vessel and a cathode and such that coating material is substantially impeded from being deposited into the vessel.

9. A sputtering apparatus anode as defined in claim 1 fixedly coupled to an outside of a coating chamber such that in operation during coating, the anode serves as a conducting container and wherein charged particles flow between the cathode in the coating chamber and the inside of the vessel for coating a substrate disposed in the coating chamber with the material.

10. A sputtering apparatus anode as defined in claim 1 wherein the opening has an area of >10 cm2.

11. A sputtering apparatus anode as defined in claim 10, wherein the opening is substantially circular and greater than 15 cm2.

12. A sputtering apparatus anode as defined in claim 1, wherein the inner body is comprised of copper.

13. A sputtering apparatus anode as defined in claim 1, wherein the inner body is comprised of stainless steel.

14. A sputtering apparatus anode as defined in claim 1 wherein an inside of the vessel is substantially cylindrical or spherical in cross section.

15. A sputtering apparatus anode as defined in claim 1, wherein a surface area of the conductive inner body is at least 300 cm2.

16. A sputtering apparatus anode as defined in claim 3, wherein the pressure in the anode cavity is at least 20% above the pressure in the coating chamber.

17. A sputtering apparatus anode as defined in claim 3, wherein the pressure in the anode cavity is at least two times above the pressure in the coating chamber.

18. A sputtering apparatus anode as defined in claim 1 wherein the opening has an area of 15 cm2 to 30 cm2.

19. A sputtering apparatus anode as defined in claim 1, wherein a surface area of the conductive inner body is at least 1200 cm2.

* * * * *